(12) United States Patent
Ito et al.

(10) Patent No.: US 9,583,613 B2
(45) Date of Patent: Feb. 28, 2017

(54) METAL OXIDE SEMICONDUCTOR DEVICES AND FABRICATION METHODS

(71) Applicant: Broadcom Corporation, Irvine, CA (US)

(72) Inventors: Akira Ito, Irvine, CA (US); Shom Ponoth, Irvine, CA (US)

(73) Assignee: BROADCOM CORPORATION, Irvine, CA (US)

(*) Notice: Subject to any disclaimer, the term of this patent is extended or adjusted under 35 U.S.C. 154(b) by 0 days.

(21) Appl. No.: 14/625,047

(22) Filed: Feb. 18, 2015

(65) Prior Publication Data

US 2016/0211367 A1    Jul. 21, 2016

Related U.S. Application Data

(60) Provisional application No. 62/104,557, filed on Jan. 16, 2015.

(51) Int. Cl.
| | | |
|---|---|---|
| *H01L 29/78* | (2006.01) | |
| *H01L 29/06* | (2006.01) | |
| *H01L 29/10* | (2006.01) | |
| *H01L 29/08* | (2006.01) | |
| *H01L 29/66* | (2006.01) | |
| *H01L 21/762* | (2006.01) | |

(52) U.S. Cl.
CPC .... *H01L 29/7824* (2013.01); *H01L 21/76283* (2013.01); *H01L 29/0649* (2013.01); *H01L 29/0653* (2013.01); *H01L 29/0865* (2013.01); *H01L 29/0882* (2013.01); *H01L 29/1095* (2013.01); *H01L 29/66681* (2013.01)

(58) Field of Classification Search
CPC ............. H01L 29/7824; H01L 29/0882; H01L 29/0649; H01L 21/76283; H01L 29/0865; H01L 29/0653; H01L 29/1095; H01L 29/66681
See application file for complete search history.

(56) References Cited

U.S. PATENT DOCUMENTS

| | | | | |
|---|---|---|---|---|
| 6,333,234 B1 * | 12/2001 | Liu | ................... | H01L 29/78612 257/E29.278 |
| 2006/0170055 A1 * | 8/2006 | Mitros | ................ | H01L 27/0629 257/360 |
| 2006/0170056 A1 * | 8/2006 | Pan | ..................... | H01L 29/0847 257/365 |

(Continued)

*Primary Examiner* — Jarrett Stark
(74) *Attorney, Agent, or Firm* — Foley & Lardner LLP (57) ABSTRACT

A semiconductor device includes a first well that is disposed in a semiconductor substrate. The semiconductor device further includes a second well that is disposed in the semiconductor substrate. The semiconductor device further includes a source region, a drain region, and a gate structure between the source region and the drain region. The gate structure is disposed above the first well. The source region includes a first conducting contact above the first well and. The drain region includes a second conducting contact above the second well, the drain region being connected with the second well at least partially through a first epi region. The first epi region and the second well are configured to lower a first driving voltage applied on the source region and the drain region to a second voltage applied on the gate structure.

17 Claims, 6 Drawing Sheets

(56) References Cited

U.S. PATENT DOCUMENTS

| | | | |
|---|---|---|---|
| 2009/0256212 A1* | 10/2009 | Denison | H01L 29/0653 257/408 |
| 2010/0032756 A1* | 2/2010 | Pendharkar | H01L 21/761 257/337 |
| 2010/0109080 A1* | 5/2010 | Huang | H01L 29/0847 257/335 |
| 2012/0205738 A1* | 8/2012 | Yang | H01L 29/66689 257/335 |
| 2015/0294984 A1* | 10/2015 | Cheng | H01L 27/1203 257/347 |
| 2015/0348825 A1* | 12/2015 | Hebert | H01L 21/764 257/522 |

* cited by examiner

METAL OXIDE SEMICONDUCTOR DEVICES AND FABRICATION METHODS

PRIORITY CLAIM

This application claims the benefit of U.S. Provisional Application No. 62/104,557, filed Jan. 16, 2015, the entirety of which is incorporated herein by reference.

TECHNICAL FIELD

This disclosure relates generally to a metal oxide semiconductor field effect transistor (MOSFET). More particularly, it relates to fabrication methods and device structures related to laterally diffused metal oxide semiconductor (LDMOS) with a fully depleted silicon on insulator (FDSOI).

BACKGROUND

Silicon semiconductor processing has evolved sophisticated operations for fabricating integrated circuits. As advancement in fabrication process technology continues, the core and Input/Output (I/O) operating voltages of integrated circuits have decreased. However, operating voltages of auxiliary devices have remained about the same. The auxiliary devices include devices interfaced to the integrated circuits. For example, the auxiliary devices may be printers, scanners, disk drives, tape drives, microphones, speakers, or cameras. Improvements in the design and fabrication of semiconductor devices will continue to drive evolution in the capabilities and performance of integrated circuits.

BRIEF DESCRIPTION OF THE DRAWINGS

The disclosed method and apparatus may be better understood with reference to the following drawings and description. In the figures, like reference numerals designate corresponding parts throughout the different views.

DETAILED DESCRIPTION

Figure 1:
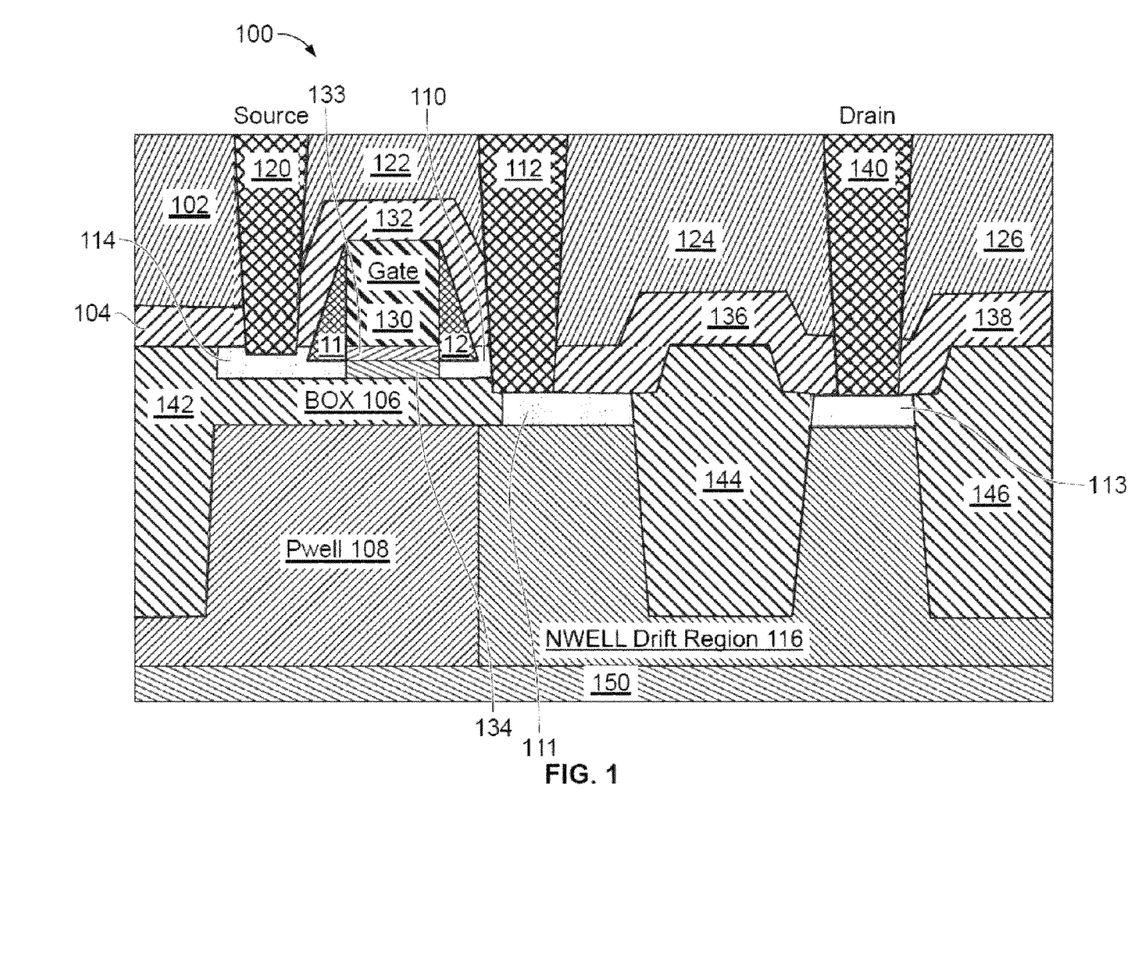
FIG. 1 shows an example cross-sectional view of a semiconductor device.

FIG. 1 shows an example cross-sectional view of a semiconductor device 100. For example, the semiconductor device 100 may be an n-type metal oxide semiconductor (NMOS) device. The semiconductor device 100 includes a semiconductor substrate 150 as a foundation at the bottom. The semiconductor device 100 includes a first well 108 and a second well 116. The first well 108 is disposed in the semiconductor substrate 150. The second well 116 is disposed in the semiconductor substrate 150. The first well 108 and the second well 116 are located adjacent to each other and are doped with different materials. For instance, the first well 108 may be a P-well doped with p-type material such as boron or other suitable materials. The second well 116 may be an N-well doped with n-type material such as phosphorous, arsenic, or other suitable materials.

The semiconductor device 100 includes a gate structure 130 disposed above the first well 108. The gate structure 130 is located between two spacers 11 and 12. The gate structure 130 is directly disposed on a dielectric layer 133, which is disposed on a silicon channel (SOI) layer 134. The dielectric layer 133 may include high-k dielectric such as hafnium oxide. Alternatively or additionally, the dielectric layer 133 may include high-k inter layer dielectric (ILD). The SOI layer 134 is disposed on a buried oxide (BOX) layer 106. The BOX layer 106 may include silicon oxide or other insulating material. The gate structure 130 may include n-type material. The gate structure 130 is at least partially covered by an isolation region 132, which may include nitride liner or other material with similar properties.

The semiconductor device 100 includes a source region above the first well 108. The source region may include a first conducting contact 120 disposed above the first well 108. The semiconductor device 100 includes a first epitaxial (epi) region 113 and a second epi region 114. The first conducting contact 120 is disposed on the second epi region 114. The first conducting contact 120 penetrates the isolation regions 104 and 132 and may directly contact the upper surface of the second epi region 114. The second epi region 114 is directly disposed on the BOX layer 106, which may be directly disposed on the first well 108. The BOX layer 106 may also contact directly with the shallow trench isolation (STI) region 142, which is adjacent to the first well 108. Compared to the first and second wells 108 and 116, the BOX layer 106 has a relatively thin profile thickness. The profile thickness of the BOX layer 106 is also thinner than the thickness of the gate structure 130 and the depth of the conducting contacts 120 and 140. For example, the BOX layer 106 may have a thickness in the range of 10 nm-30 nm. The first epi region 113 may have a thickness in the range of 15 nm-30 nm. The other epi regions 110, 111, and 114 may have a similar thickness in the range of 15 nm-30 nm. The STI regions 142, 144, and 146 may have a thickness in the range of 100 nm-200 nm.

The semiconductor device 100 includes a drain region including a second conducting contact 140 above the second well. The drain region may be connected with the second well 116 at least partially through a first epi region 113. The second conducting contact 140 penetrates the isolation regions 136 and 138.

The semiconductor device 100 includes a third conducting contact 112 that penetrates the isolation regions 132 and 136. The conducting contacts 112, 120 and 140 may include Tungsten or other material with similar properties. The third conducting contact 112 directly contacts both the third epi region 110 and the fourth epi region 111. Thus, the third epi region 110 and the fourth epi region 111 are electrically connected while physically separated. The first epi region 113 and the N-Well region 116 are configured to lower a first driving voltage on the semiconductor device 100 to a second driving voltage on the gate structure 130. The fourth epi region 111 may further lower the second driving voltage on the gate structure 130. For example, the first driving voltage may be in the range of 1.8V or higher while the second driving voltage may be 1.8V or lower. More specifically, the first driving voltage may be 5.0V while the second driving voltage may be 1.8V or lower. The first driving voltage may be applied between the source and gain and the second driving voltage may be applied between the gate structure 130 and the SOI layer 134.

In FIG. 1, the regions 102, 122, 124, and 126 may include the same material or material with similar conducting properties. For example, the regions 102, 122, 124, and 126 may include middle-end-of-the-line (MEOL) oxide. The isolation regions 104, 132, 136, and 138 may include same material or material with similar properties. For example, the isolation regions 104, 132, 136, and 138 may include Nitride liner. Alternatively, the isolation regions 104, 132, 136, and 138 may include silicon oxide or lower-k silicon nitride such as SiCBN. The epi regions 110, 111, 113, and 114 may include n-type material. For example, the epi regions 110, 111, 113, and 114 may include n-type material doped Silicon epitaxy (N+Si EPI), which may include SiCP, SiP, or other materials with similar properties. The STI regions 142, 144, and 146 may include a dielectric material, such as $SiO_2$ or other suitable material.

Figure 2:
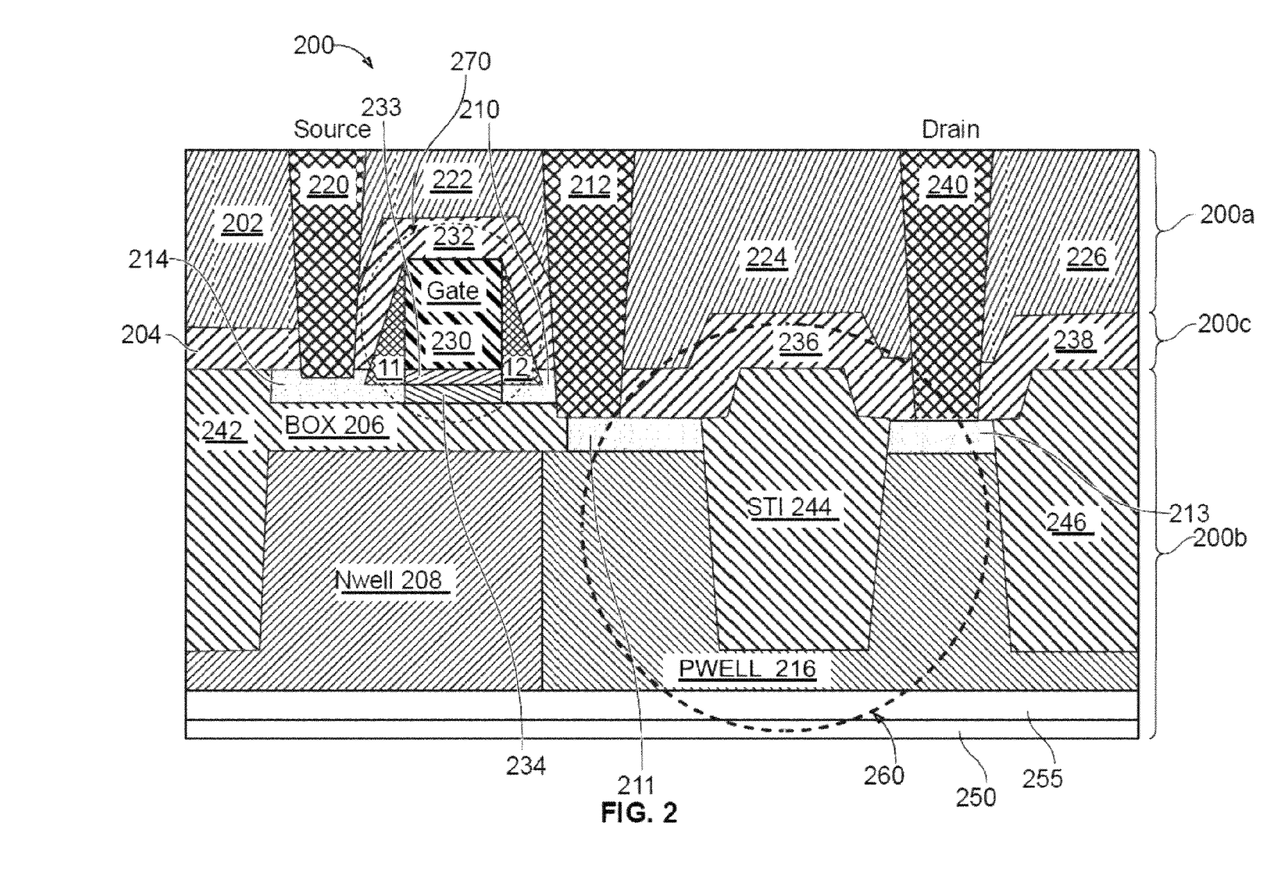
FIG. 2 shows an example cross-sectional view of a semiconductor device.

FIG. 2 shows an example cross-sectional view of a semiconductor device 200. The layout of the semiconductor device 200 is very similar to the semiconductor device 100. The semiconductor device 200 includes a first semiconductor structure 200a on the top, a second semiconductor structure 200b at the bottom, and an isolation layer 200c between the two semiconductor structures. One of the differences between the semiconductor device 100 and the semiconductor device 200 is that the semiconductor device 100 is a NMOS while the semiconductor device 200 is a PMOS. Thus, the first well 208 is a N-well and the second well 216 is a P-well. Further, the epi regions 210, 211, 213, and 214 are doped with p-type material. Moreover, there is a deep N-well 255 disposed directly on top of the substrate 250. The first well 208 and the second well 216 are directly disposed on top of the N-well 255. For example, the epi regions 210, 211, 213, and 214 may include P+Si epi, which may include SiB, SiGeB, or other materials with similar properties. The gate structure 230 may include p-type material.

Similar to the semiconductor device 100 FIG. 1, the semiconductor device 200 includes a source region above the first well 208 and a drain region above the second well 216. The semiconductor device 200 also includes a gate structure 230 between two conducting contacts 220 and 212.

In FIG. 2, the regions 202, 222, 224, and 226 are similar to regions 102, 122, 124, and 126 in FIG. 1. The STI regions 242, 244, and 246 are similar to STI regions 142, 144, and 146 in FIG. 1. The regions 204, 232, 236, and 238 are similar to regions 104, 132, 136, and 138. The layers 233 and 234 are similar to the layers 133 and 134 in FIG. 1. The conducting contacts 220, 212, and 240 are similar to the conducting contacts 120, 112, and 140 in FIG. 1.

FIG. 2 may be described in another way. For example, the semiconductor structure 200 includes contacts (e.g., for a source and a drain connection), a switching structure 270 in the semiconductor structure 200b, and a voltage reduction structure 260 between the contacts. The voltage reduction structure 260 may be defined by an area surrounded by the dashed lines. The voltage reduction structure 260 drops the applied drain voltage to a level compatible with the design and fabrication of the switching structure 270. The switching structure 270 may include a gate structure 230 for a transistor 200b. The voltage reduction structure 260 may include an N or P Well drift region and epi regions. For instance, in FIG. 2, the voltage reduction structure 260 includes a P-Well 216 and epi regions 211 and 213. The thickness of the epi regions may be less than about 25 mm. The thickness of the STI regions 242, 244, and 246 may be in the range of 100 nm-200 nm.

Figure 3:
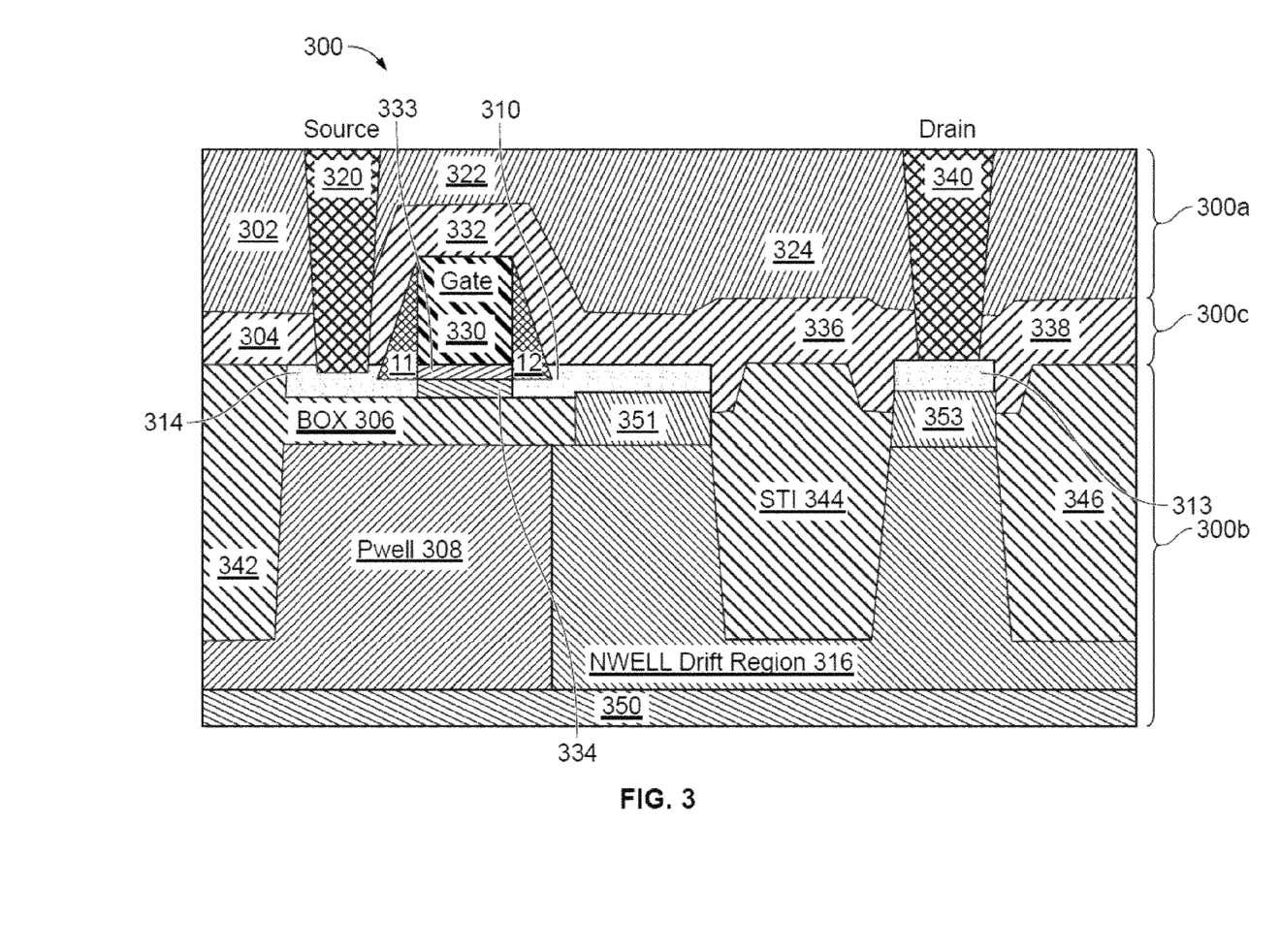
FIG. 3 shows an example cross-sectional view of a semiconductor device.

FIG. 3 shows another example cross-sectional view of a semiconductor device 300. The device 300 includes a first semiconductor structure 300a on the top, a second semiconductor structure 300b at the bottom, and an isolation layer 300c between the two semiconductor structures. The first semiconductor structure 300a includes multiple conducting contacts 320 and 340. The second semiconductor structure 300b includes a plurality of wells 308 and 316.

The semiconductor device 300 includes a gate structure 330 disposed between two conducting contacts 320 and 340. The gate structure 330 is disposed adjacent to the source region. For example, the gate structure 330 is disposed above the BOX layer 306 and adjacent to the conducting contact 320. The structure 330 is located between two spacers 11 and 12.

Compared to the semiconductor device 100 in FIG. 1, the semiconductor device 300 includes two conducting contacts 320 and 340. The semiconductor device 300 further includes three epi regions 313, 314, and 310. The first epi region 313 may be located directly under the second conducting contact 340. The second epi region 314 may be located directly under the first conducting contact 320. The third epi region 310 and the second epi region 314 are on different sides of the gate structure 330. The first epi implanted region 353 may be located directly under the first epi region 313.

Compared to the semiconductor device 100 in FIG. 1, the third epi region 310 extends beyond a side edge of the BOX layer 306 underneath. The third epi region 310 may directly contact the second epi implanted region 351, which is disposed between the STI region 344 and the BOX layer 306. The second epi implanted region 351 may be in direct contact with a bottom surface of the third epi region 310. The third epi region 310 may completely cover the upper surface of the second epi implanted region 351. For example, the epi implanted regions 351 and 353 may be undoped silicon epitaxy followed by implantation.

Here, the third epi region 310 may be configured to lower a first driving voltage on the first semiconductor structure 300a to a second driving voltage on the second semiconductor structure 300b. Similarly, the region 316 may further drop the voltage in combination with regions 313, 353, 316, 351, 310. The first driving voltage may be 1.8V or higher and the second driving voltage may be 1.8V or lower. For example, the first driving voltage may be 5.0V and the second driving voltage may be 3.3V. The semiconductor device 300 may be used in a consumer electronic device such as a smart phone or a media player. The consumer electronic device may be configured such that the voltage in the channel underneath the gate structure 330 is less than or equal to 1.8V. Accordingly, the voltage drop across regions 353 and vertical part of 316 may be (5−1.8)/2=1.6V. The majority of the vertical voltage drop is caused by the vertical part of 316 and epi implanted region 351 and 353. The horizontal drop at the bottom of the region 316 may be relatively small due to this region being highly doped. Similarly there is a relatively small voltage drop within epi regions 310 and 313 because the two epi regions 310 and 313 are highly doped.

The semiconductor device 300 includes a layer 300c disposed between the first semiconductor structure 300a and the second semiconductor structure 300b. The layer 300c may include four regions: 304, 332, 336, and 338, which may include nitride liner. Alternatively, the regions 304, 332, 336, and 338 may include silicon oxide or lower-k silicon nitride such as SiCBN.

In FIG. 3, the second semiconductor structure 300b may include a laterally diffused metal oxide semiconductor (LD- MOS). The LDMOS may include a first well 308 and a second well 316 doped with different materials. The first and second wells 308 and 316 may be implanted in a semiconductor substrate 350 at the bottom. The first well 308 may be a P-well and the second well 316 may be a N-well. Both wells 308 and 316 may form drift regions. The LDMOS may further include three STI regions 342, 344, and 346.

Figure 4:
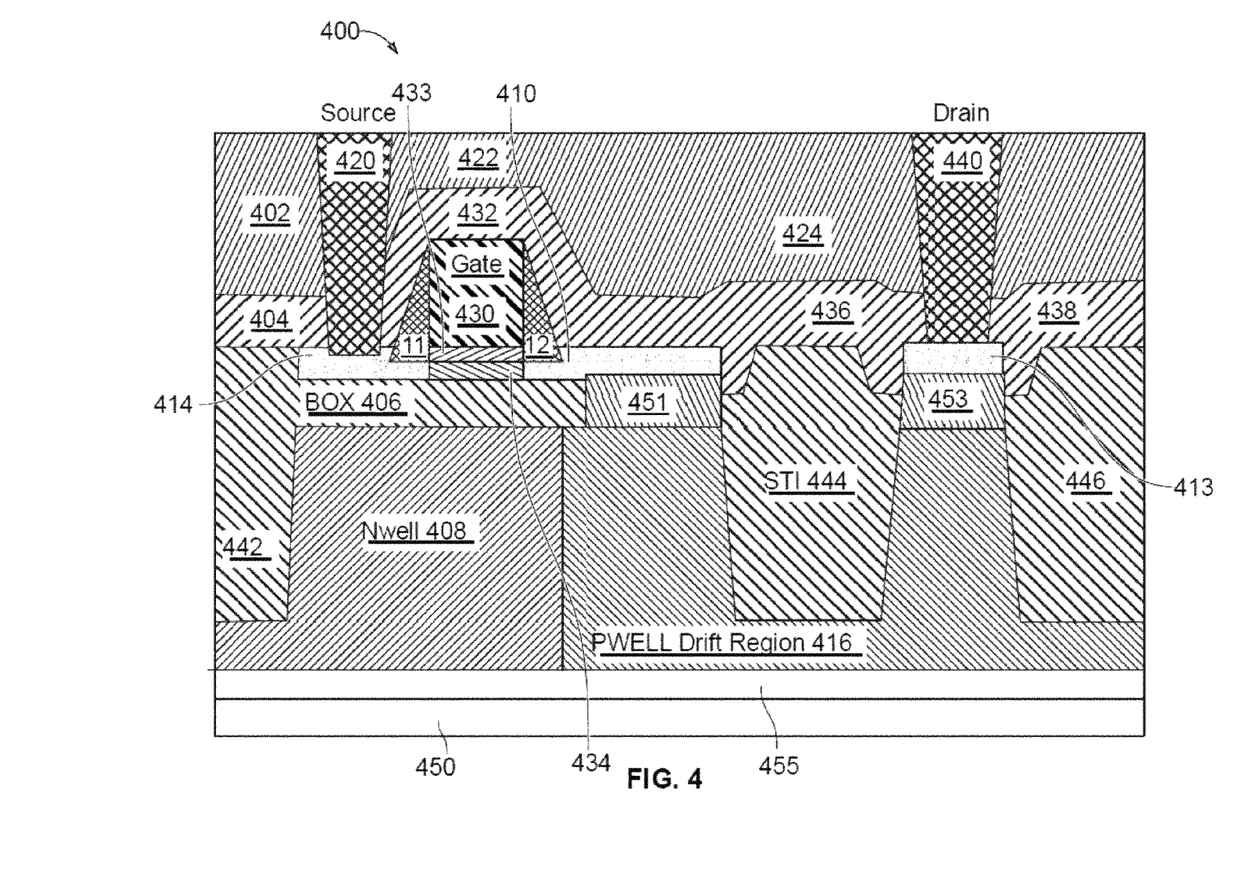
FIG. 4 shows an example cross-sectional view of a semiconductor device.

FIG. 4 shows another example cross-sectional view of a semiconductor device 400. The semiconductor device 400 may be a PMOS structure with similar structure as the NMOS structure in FIG. 3. The NMOS in FIG. 3 is built with n-type source and drain and a p-type substrate, while the PMOS in FIG. 4 is built with p-type source and drain and a n-type substrate. In the NMOS, carriers are electrons, while in a PMOS, carriers are holes.

In FIG. 4, the first well 408 is a N-well and the second well 416 is a P-well. There is a deep N-well 455 disposed directly on top of the substrate 450. The first well 408 and the second well 416 are directly disposed on top of the N-well 455. Further, the epi regions 410, 413, and 414 are doped with p-type material. For example, the epi regions 410, 413, and 414 may include P+Si epi, which may include SiB, SiGeB, or other materials with similar properties. The gate structure 430 may include p-type material.

In FIG. 4, the regions 402, 422, 424, and 426 are similar to regions 302, 322, 324, and 326 in FIG. 3. The STI regions 442, 444, and 446 are similar to STI regions 342, 344, and 346 in FIG. 3. The regions 404, 432, 436, and 438 are similar to regions 304, 332, 336, and 338. The layers 433 and 434 are similar to the layers 333 and 334 in FIG. 3. The conducting contacts 420 and 440 are similar to the conducting contacts 320 and 340 in FIG. 3. The regions 451 and 453 may be similar to the regions 351 and 353 in FIG. 3.

The above embodiments may be combined to from more semiconductor devices. For example, symmetrical LDMOS structures may be formed using one or more embodiments in FIGS. 1-4.

In the above embodiments, the p-type material may be obtained by a doping process by adding a certain type of atoms to the semiconductor in order to increase the number of positive carriers (holes). The spacers 11 and 12 are typically a dielectric material, such as $SiO_2$, though any suitable material can be used. The wells may have a concentration of p-type material or n-type material in the range of $5 \times 10^{16}$ cm$^{-3}$ to $1 \times 10^{18}$ cm$^{-3}$.

Figure 5:
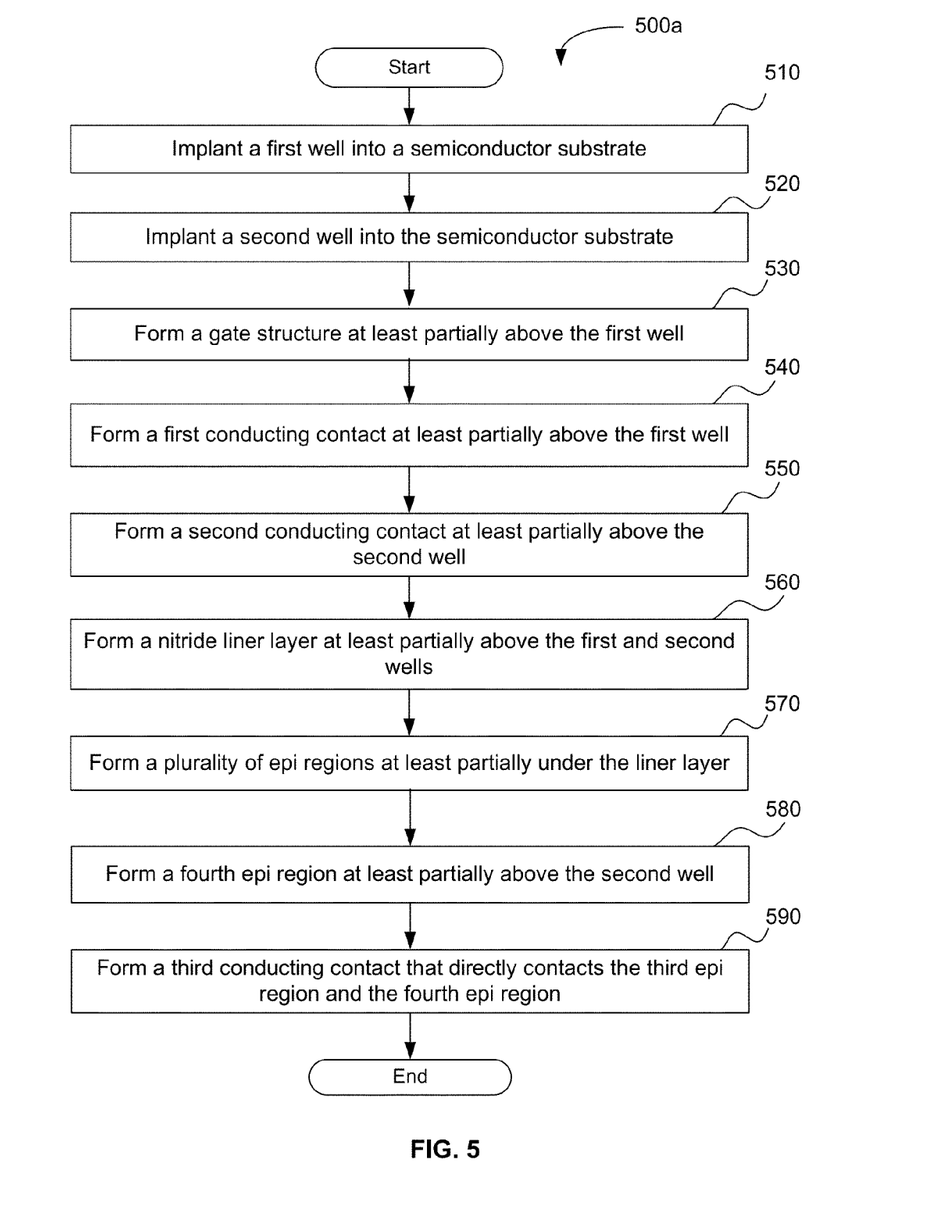
FIG. 5 shows an example fabrication process for fabricating a semiconductor device.

FIG. 5 shows an exemplary fabrication process 500a for fabricating a semiconductor device with increased breakdown voltage. The method 500a is for illustration only, and the processes described below do not have to be carried out in the described order. Also, other fabrication steps may be introduced.

In the fabrication process 500a, a first well is fabricated by implanting the first well into a semiconductor substrate (510). This step may include implanting a semiconductor substrate with an appropriate impurity to form a P-well or an N-well. For example, implanting the substrate with boron, a p-type material, forms the P-well, while implanting the substrate with phosphorous or arsenic, both n-type materials, forms the N-well.

A second well is fabricated by implanting a semiconductor substrate into the semiconductor substrate (520). This step may include implanting a semiconductor substrate with an appropriate impurity to form a P-well or an N-well. The first well and the second wells have different conductivity types. For example, the second well may be an N-well when the first well is a P-well. The second well may be a P-well when the first well is an N-well.

A gate structure is formed by fabricating at least one semiconductor substrate at least partially on the first well (530). This step may include implanting a semiconductor substrate with polycrystalline silicon, though any suitable material can be used, on top of a gate oxide to form the gate structure. The gate structure may include multiple gates. Lightly implanting the polycrystalline silicon with the appropriate impurity increases the breakdown voltage of the transistor. Lightly implanting n-type material into the polycrystalline silicon to form an N-region creates the gate of an NMOS device, while lightly implanting p-type material polycrystalline silicon to form a P-region creates the gate of a PMOS device. In exemplary embodiment, the gate is lightly disposed on the order of $10^{18}$ cm$^{-3}$.

A first conducting contact is formed by fabricating conducting material at least partially above the first well (540). This may include fabricating a conducting material such as metal in MEOL regions. The conducting contact may be formed on an epi region that is disposed on top of a BOX layer. The conducting contact may penetrate a nitride liner layer. In the cross-sectional view, the first conducting contact may have a trapezoid shape.

A second conducting contact is formed by fabricating conducting material at least partially above the second well (550). This may include fabricating a conducting material such as metal in MEOL regions. The conducting contact may be formed on an epi region that is disposed between two STI regions. The conducting contact may penetrate a nitride liner layer. In the cross-sectional view, the second conducting contact may have a trapezoid shape. The first and second conducting contacts may have upper surfaces at about the same vertical level. The first and second conducting contacts may have lower surfaces at different vertical levels.

A nitride liner layer is fabricated by implanting a plurality of nitride liner regions above the first and second wells (560). This step may include implanting a first nitride liner region on a first STI region. In addition, a second nitride liner region is formed on the gate structure. A third and fourth nitride liner region are formed on a second and third STI regions.

A plurality of epi regions are fabricated at least partially under the nitride liner layer (570). The plurality of epi regions include a first epi region, a second epi region, and a third epi region. The first epi region is disposed directly under a first conducting contact. The second epi region is directly below a second conducting contact and on one side of the gate structure. The third epi region is on a different side of the gate structure. The epi regions may include N doped Silicon epitaxy in a N-LDMOS. The epi regions may include P doped Silicon epitaxy in a P-LDMOS.

A fourth epi region is fabricated at least partially above the second well (570). The fourth epi region may be formed between the BOX layer and a STI region. The fourth epi region may be disposed above the second well directly. The fourth epi region is directly under a nitride liner region.

A third conducting contact is fabricated at least partially above fourth epi region (580). The third conducting contact may be configured to electrically connect the third epi region and the fourth epi region. The third conducting contact may be disposed adjacent to the gate structure. As shown in FIG. 1, the third conducting contact 112 and the first conducting contact 120 are on different sides of the gate structure 130.

Figure 6:
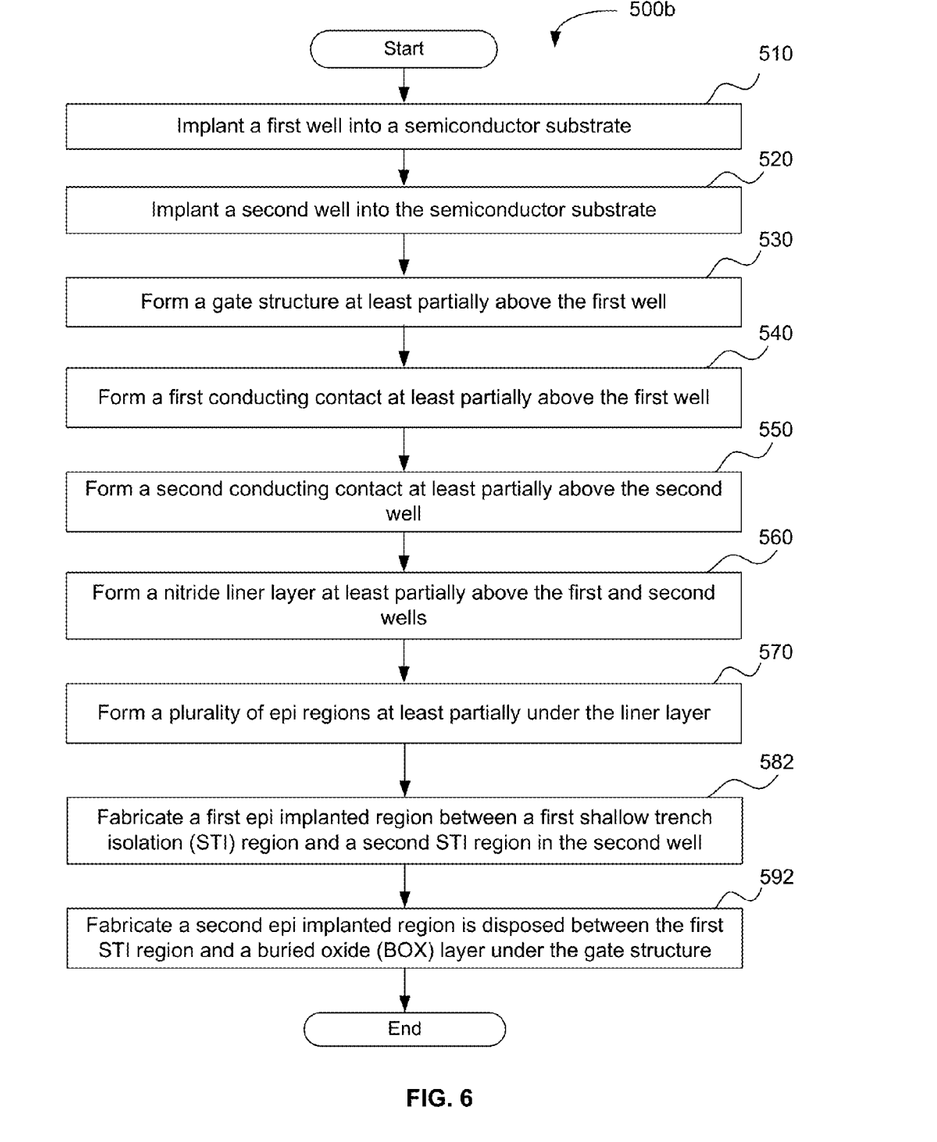
FIG. 6 shows an example fabrication process for fabricating a semiconductor device.

FIG. 6 shows an exemplary fabrication process 500b for fabricating a semiconductor device with increased breakdown voltage. The method 500b is for illustration only, and the processes described below do not have to be carried out in the described order. Also, other fabrication steps may be introduced.

The steps 510-570 correspond to those shown in FIG. 5. In step 582, a first epi implanted region is fabricated between a first STI region and a second STI region in the second well, where the first epi implanted region is disposed directly below one of the plurality of epi regions. For example, as shown in FIG. 3, the first epi implanted region 353 is formed between the two STI regions 344 and 346. The first epi implanted region 353 is formed directly under the second conducting contact 340.

In step 592, a second epi implanted region is fabricated between the first STI region and a BOX layer under the gate structure. For example, as shown in FIG. 3, the second epi implanted region 351 is formed between the STI region 344 and the BOX layer 306. The second epi implanted region 351 is formed directly below the third epi region 310, which extends beyond a side edge of the BOX layer 306 underneath. The third epi region 310 directly touches both the BOX layer 306 and the second epi implanted region 351.

The methods, devices, and logic described above may be implemented in many different ways in many different combinations of hardware. The semiconductor structures described above facilitate compatibility between Fully Depleted Silicon on Insulator (FDSOI) devices and high voltage devices such as LDMOS based power amplifiers, power management, and general purpose device. Devices that include the semiconductor structures may be included in a phone, a laptop, a circuitry, a controller, a microprocessor, an application specific integrated circuit (ASIC), or any other circuitry. The embodiments disclose are for illustrative purposes only, and are not limiting. Many other embodiments and implementations are possible.

What is claimed is:

1. A semiconductor device, comprising:
    a first well disposed in a semiconductor substrate;
    a second well disposed in the semiconductor substrate;
    a gate structure disposed above the first well;
    a source region comprising a first conducting contact above the first well;
    a drain region comprising a second conducting contact above the second well, the drain region being connected with the second well at least partially through a first epitaxial (epi) region,
    wherein the first epi region and the second well are configured to lower a first driving voltage applied on the source region and the drain region to a second voltage applied on the gate structure; and
    a second epi region directly below the source region, the second epi region connecting with the first well through a buried oxide (BOX) layer.

2. The semiconductor device of claim 1, further comprising a third epi region directly disposed on the BOX layer and connected to a fourth epi region through a conducting contact, the fourth epi region directly disposed on the second well.

3. The semiconductor device of claim 2, wherein the third epi region is disposed between the BOX layer and a shallow trench isolation (STI) region.

4. The semiconductor device of claim 3, wherein the STI region is disposed between the first epi region and the third epi region, and wherein the STI region is covered by a nitride liner layer.

5. The semiconductor device of claim 1, wherein the second epi region is on one side of the gate structure, wherein the semiconductor device further comprises:
    a third epi region on a different side of the gate structure;
    a first epi implanted region directly under the first epi region; and
    a second epi implanted region in direct contact with the third epi region.

6. The semiconductor device of claim 5, wherein the first epi implanted region is disposed between a first shallow trench isolation (STI) region and a second STI region.

7. The semiconductor device of claim 6, wherein the second epi implanted region is disposed between the first STI region and the buried oxide (BOX) layer under the gate structure.

8. A semiconductor device, comprising:
    a first semiconductor structure comprising a plurality of conducting contacts;
    a second semiconductor structure disposed under the first semiconductor structure, the second semiconductor structure comprising a plurality of wells;
    a gate structure disposed between two conducting contacts;
    a liner layer disposed between the first semiconductor structure and the second semiconductor structure;
    a first epi region disposed directly under a first conducting contact in the first semiconductor structure;
    a second epi region directly below a second conducting contact and on one side of the gate structure; and
    a third epi region on a different side of the gate structure;
    wherein the third epi region is in direct contact with an epi implanted region disposed between a shallow trench isolation (STI) region and a buried oxide (BOX) layer.

9. The semiconductor device of claim 8, wherein second semiconductor structure comprises a plurality of shallow trench isolation (STI) regions disposed at least partially in the plurality of wells.

10. The semiconductor device of claim 9, further comprising a plurality of epi regions disposed at least partially under the liner layer.

11. The semiconductor device of claim 8, wherein the second semiconductor structure comprises a laterally diffused metal oxide semiconductor (LDMOS).

12. The semiconductor device of claim 11, wherein the LDMOS comprises a first well and a second well doped with different materials.

13. A semiconductor device, comprising:
    a first semiconductor structure comprising a plurality of conducting contacts;
    a second semiconductor structure disposed under the first semiconductor structure, the second semiconductor structure comprising a plurality of wells;
    a gate structure disposed between two conducting contacts;
    a liner layer disposed between the first semiconductor structure and the second semiconductor structure;
    a first epi region disposed directly under a first conducting contact in the first semiconductor structure;
    a second epi region directly below a second conducting contact and on one side of the gate structure; and
    a third epi region on a different side of the gate structure, wherein the third epi region is in direct contact with a third conducting contact, and wherein the third conducting contact is in direct contact with a fourth epi region.

14. A semiconductor device, comprising:
    a first well formed in a semiconductor substrate;
    a second well formed in the semiconductor substrate;
    a gate structure positioned at least partially above the first well;

a first conducting contact positioned at least partially above the first well;

a second conducting contact positioned at least partially above the second well;

a nitride liner layer at least partially above the first and second wells;

a plurality of spaced apart epitaxial (epi) regions positioned at least partially under the nitride liner layer, the plurality of epi regions comprising a first epi region disposed directly under the first conducting contact, a second epi region positioned directly below the second conducting contact and on one side of the gate structure, and a third epi region positioned on a different side of the gate structure;

a fourth epi region positioned at least partially above the second well; and a third conducting contact positioned to directly contact the third epi region and the fourth epi region so that the third epi region and the fourth epi region are electronically connected while physically separated.

15. The semiconductor device of claim 14, further comprising:

a first epi implanted region positioned between a first shallow trench isolation (STI) region and a second STI region in the second well, wherein the first epi implanted region is disposed directly below one of the plurality of space apart epi regions.

16. The semiconductor device of claim 15, further comprising:

a second epi implanted region disposed between the first STI region and a buried oxide (BOX) layer under the gate structure.

17. The semiconductor device of claim 14, wherein the first epi region is disposed between the first conducting contact and a buried oxide (BOX) layer positioned under the gate structure.

* * * * *